United States Patent [19]
Takahashi et al.

[11] Patent Number: 5,879,851
[45] Date of Patent: Mar. 9, 1999

[54] METHOD FOR FORMING RESIST PATTERNS BY USING AN AMMONIUM OR MORPHOLINE COMPOUND AS A DEVELOPER

[75] Inventors: Makoto Takahashi; Satoshi Takechi, both of Kawasaki, Japan

[73] Assignee: Fujitsu Limited, Kawasaki, Japan

[21] Appl. No.: 718,515

[22] PCT Filed: Feb. 9, 1996

[86] PCT No.: PCT/JP96/00295

§ 371 Date: Oct. 8, 1996

§ 102(e) Date: Oct. 8, 1996

[87] PCT Pub. No.: WO96/24888

PCT Pub. Date: Aug. 15, 1996

[30] Foreign Application Priority Data

Feb. 10, 1995 [JP] Japan ..................................... 7-23053

[51] Int. Cl.$^6$ .................................................... G03C 5/18
[52] U.S. Cl. ............................ 430/149; 430/331; 430/326
[58] Field of Search .................................. 430/149, 326, 430/331

[56] References Cited

FOREIGN PATENT DOCUMENTS

| | | |
|---|---|---|
| 52-143769 | 11/1977 | Japan . |
| 58-80638 | 5/1983 | Japan . |
| 4-155344 | 5/1992 | Japan . |
| 5-80515 | 4/1993 | Japan . |
| 5-297591 | 11/1993 | Japan . |
| 6-3825 | 1/1994 | Japan . |
| 6-95390 | 4/1994 | Japan . |
| 6-242607 | 9/1994 | Japan . |
| 6-266108 | 9/1994 | Japan . |
| 7-28246 | 1/1995 | Japan . |
| 7-128858 | 5/1995 | Japan . |
| 7-140661 | 6/1995 | Japan . |

*Primary Examiner*—Maria Nuzzolillo
*Assistant Examiner*—Laura Weiner
*Attorney, Agent, or Firm*—Armstrong, Westerman, Hattori, McLeland & Naughton

[57] ABSTRACT

A method for forming resist patterns comprising coating a resist comprising a polymeric or copolymeric compound having a repeating unit comprising a protected alkali-soluble group in which the protecting group is cleaved with an acid so that the compound is made alkali-soluble, and an acid generator capable of generating an acid upon the radiation exposure to a substrate to be fabricated, then pre-baking the formed resist film, successively selectively exposing the resist film, thereafter, developing a latent image with a developer containing an aqueous or alcoholic solution of a specified ammonium compound or morpholine compound. According to this method, crack formation and peeling of a pattern can be suppressed at the time of forming resist patterns.

9 Claims, No Drawings

METHOD FOR FORMING RESIST PATTERNS BY USING AN AMMONIUM OR MORPHOLINE COMPOUND AS A DEVELOPER

TECHNICAL FIELD

The present invention relates to a method for forming resist patterns. More specifically, it relates to a method for forming resist patterns by using a chemical amplification resist having high resolution, high sensitivity and an excellent dry etching resistance. A pattern formation method of the present invention can be advantageously used in the production of, for example, semiconductor devices and others.

BACKGROUND ART

Recently, semiconductor integrated circuits have been further integrated so that LSI and VLSI can be practically utilized. Simultaneous with this tendency, the minimum pattern on the integrated circuit now has a size in the submicron region and finer. In the formation of a fine pattern, it is essential to use a lithography technique comprising covering a base or substrate to be fabricated, having a film formed thereon with a resist, then selectively exposing the same to form a latent image of a desired pattern, thereafter, developing the latent pattern to form a resist pattern, successively, conducting dry etching such that the resist pattern is used as a mask, followed by removing the resist, whereby a desired pattern is obtained. As the exposing source used in this lithography, ultraviolet light rays such as g-line (wave length of 436 nm) and i-line (wave length of 365 nm) have been used. However, as a pattern becomes finer, far ultraviolet light, vacuum ultraviolet light, electron beam, X ray, etc., which have shorter wavelengths, have been utilized. Particularly, recently, excimer laser (KrF laser having a wave length of 248 nm, ArF laser having a wave length of 193 nm) has become available as a light source and is expected to be effective in the formation of a fine pattern. In the specification of the present application, the term "radiation" includes light from these various light sources, i.e., ultraviolet light, far ultraviolet light, vacuum ultraviolet light, electron beam (EB), X ray, various kind of laser beam, etc.

In order to form a submicron pattern using an exposure light in the region of far ultraviolet light or vacuum ultraviolet light having a shorter wave length, a resist is required to have an excellent transparency at the wave length of the exposure light. Further, it is demanded to have an adequate dry etching resistance for utilization as a resist. Such a resist is, for example, a radiation-sensitive material characterized by comprising a polymer or copolymer of an acrylate or α-substituted acrylate having an adamantane skeleton in the ester portion thereof, which has been invented by the present inventors (see, Japanese Unexamined Patent Publication (Kokai) No. 4-39665). Further, the present inventors have invented, as a similar resist, a chemical amplification radiation-sensitive material characterized by comprising a polymer or copolymer of an acrylate or α-substituted acrylate having a norbornene skeleton in the ester portion thereof (see, Japanese Unexamined Patent Publication (Kokai) No. 5-257181) as well as a chemical amplification radiation-sensitive material comprising a polymer or copolymer of cyclohexylmaleimide (see, Japanese Unexamined Patent Publication (Kokai) No. 5-257285).

The chemical amplification radiation-sensitive materials as mentioned above have problems of low solubility in an aqueous alkaline solution, which is the developer, and poor adhesion. Thus, in order to solve these problems, the present inventors have found a pattern formation method, comprising adding isopropyl alcohol to an aqueous organic alkaline solution as a developer, and filed the patent application (Japanese Patent Application No. 6-276597, filed on Nov. 10, 1994).

DISCLOSURE OF THE INVENTION

The chemical amplification resist and the pattern formation method using the same, which were previously invented, have a high transparency to light from various light sources, especially excimer light having a wave length within the range of far ultraviolet and vacuum ultraviolet ray and also have an excellent dry etching resistance. The resist, however, is liable to form cracks and cause peeling of the pattern at the time of developing. Thus, it still has the problem of being unable to obtain stable pattern characteristics. Although the actual reasons why such problems are caused are not clear, it can be understood that one reason is that an aliphatic hydrocarbon group included in the resist structure is highly hydrophobic and stiff so that the distortion imposed on the resist film at the time of developing would become large.

The object of the present invention is to provide an improved resist pattern formation method which can reduce the cracks and peeling of a pattern at the time of developing, i.e., can produce stable patterning characteristics by using a chemical amplification resist having a high transparency to various radiations including excimer light and an excellent dry etching resistance.

According to the present invention, the above-described object can be achieved by a resist pattern formation method characterized by comprising coating a resist comprising a polymeric or copolymeric compound having a repeating unit comprising a protected alkali-soluble group which is cleaved with an acid so that the compound is made alkali-soluble, and an acid generator capable of generating an acid when a radiation is applied to a substrate to be fabricated, after pre-baking the formed resist film, selectively exposing the resist film on the substrate to radiation capable of inducing the generation of an acid from the above-described acid generator, and after post-baking the exposed resist, developing a latent image formed during the exposure step with a developer comprising an aqueous solution or alcoholic solution of an ammonium compound having the following formula (I):

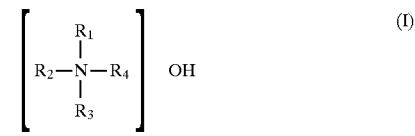

wherein $R_1$, $R_2$, $R_3$ and $R_4$ may be the same or different, and each represents a substituted or unsubstituted hydrocarbon group having 1 to 6 carbon atoms, provided that at least one of these groups is an alkyl group having 2 to 6 carbon atoms, or a morpholine compound having the following formula (II):

THE BEST MODE FOR CARRYING OUT THE INVENTION

A resist used in the resist pattern formation method according to the present invention is a chemical amplification resist comprising a combination of a polymeric or copolymeric compound wherein a protecting group is cleaved with an acid so that the polymeric or the copolymeric compound may become alkali-soluble ("copolymer" herein includes a copolymer comprising three components or more), and an acid generator.

The polymer or the copolymer has a protected alkali-soluble group as described above. The preferable example of the alkali-soluble group is a carboxylic acid group, which is a nonlimiting example. For example, the protected carboxyl group is a unit capable of generating carboxylic acid by removing the protecting group with an acid. The examples of the same include quaternary carbon esters such as t-butyl ester, t-amyl ester and α,α-dimethyl benzyl ester; esters comprising acetals such as tetrahydropyranyl ester; esters comprising β-oxyketones such as 3-oxycyclohexyl ester and the like. As the protecting group for the alkali-soluble group, mention may be made of, preferably, quaternary carbon groups such as t-butyl group or β-oxyketone group such as 3-oxocyclohexyl group.

The polymer or the copolymer preferably further comprises an alicyclic hydrocarbon group. It is more preferable that such an alicyclic hydrocarbon group is included in repeating units other than those comprising the above-described protected alkali-soluble group. Examples of appropriate alicyclic hydrocarbon groups are those comprising the following compounds as the skeleton.

(1) Adamantane and derivatives thereof,
(2) Norbornane and derivatives thereof,
(3) Cyclohexane and derivatives thereof,
(4) Perhydroanthracene and derivatives thereof,
(5) Perhydronaphthalene and derivatives thereof,
(6) Tricyclo [5, 2, 1, 0$^{2,6}$] decane and derivatives thereof,
(7) Bicyclohexane and derivatives thereof,
(8) Spiro [4, 4] nonane and derivatives thereof, and
(9) Spiro [4, 5] decane and derivatives thereof.

These compounds can be represented by the following structural formulae, respectively.

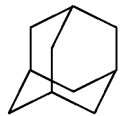
(1)

(2)

(3)

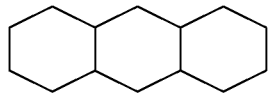
(4)

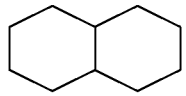
(5)

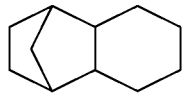
(6)

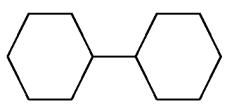
(7)

(8)

(9)

Among these compounds, in order to obtain a dry etching resistance comparable to that of the novolak type resist, condensed rings such as adamantane are especially preferable.

Acid-decomposable polymers or copolymers used in the method of the present invention can be optionally selected from various kind of compounds and used. However, meth (acrylate) polymers having the following formula (III), meth (acrylate) copolymers having the following formula (IV) and meth (acrylate) terpolymers having the following formula (V) are preferable.

(III)

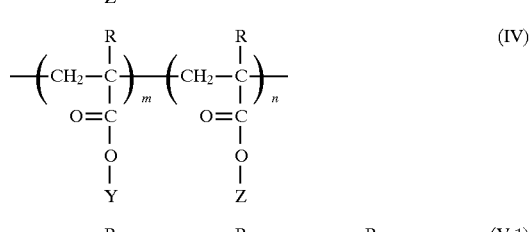
(IV)

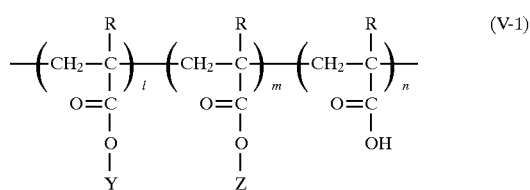
(V-1)

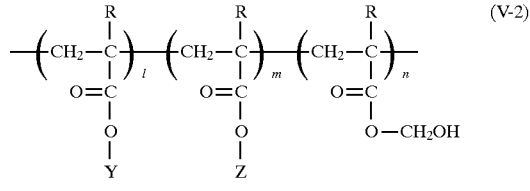
(V-2)

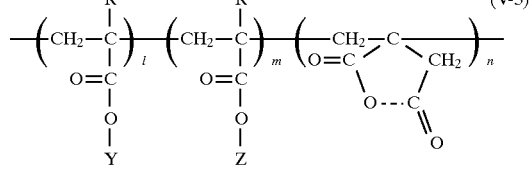
(V-3)

wherein R may be the same or different and each represents a hydrogen or methyl group, Y represents an alicyclic hydrocarbon group, preferably an adamantyl, norbornyl, cyclohexyl, tricyclo [5, 2, 1, 0] decanyl, Z represents a protecting group for carboxylic acid, preferably, a quaternary carbon group or β-oxyketone group, for example, t-butyl group, t-amyl group, 3-oxocyclohexyl group, and l, m and n each represents an optional positive integer.

More specifically, the polymers or copolymers advantageously used in the method of the present invention include, but are not limited to, the following compounds. In the formulae, l, m and n have the same definitions as those mentioned above.

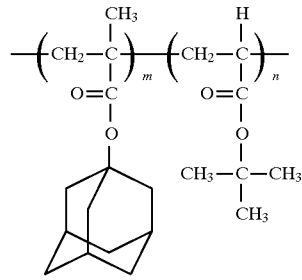 (VI)

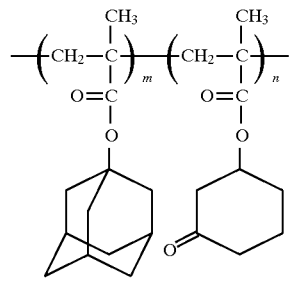 (VII)

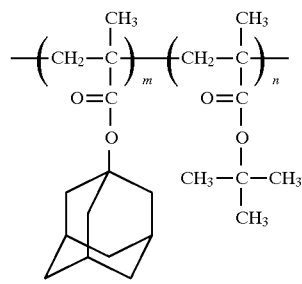 (VIII)

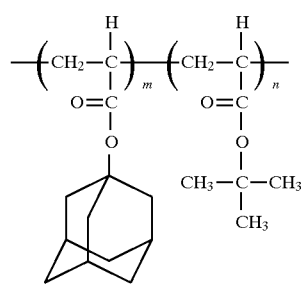 (IX)

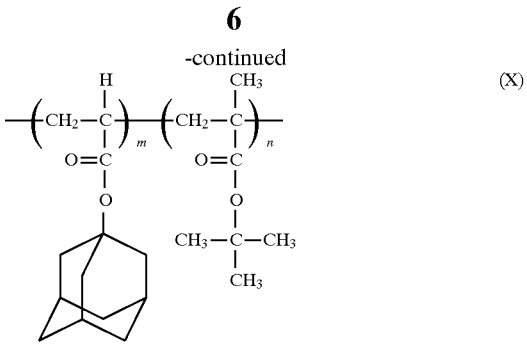 (X)

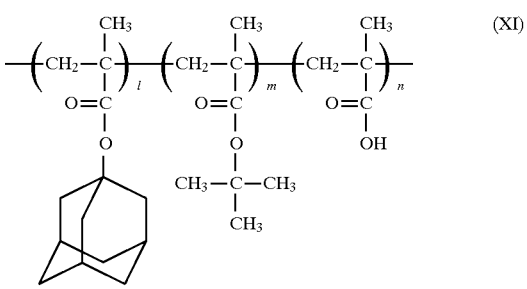 (XI)

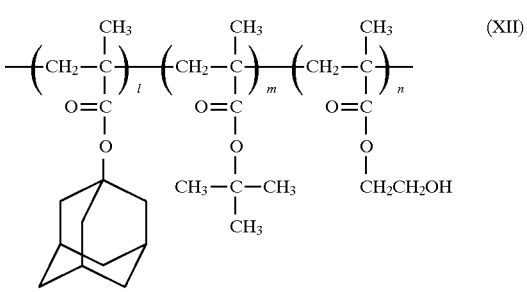 (XII)

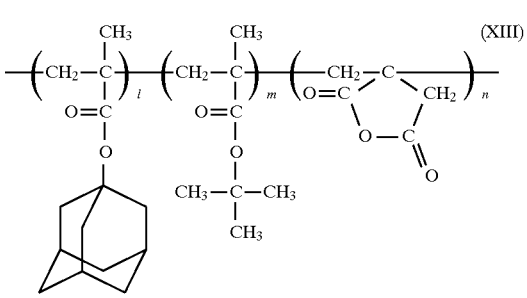 (XIII)

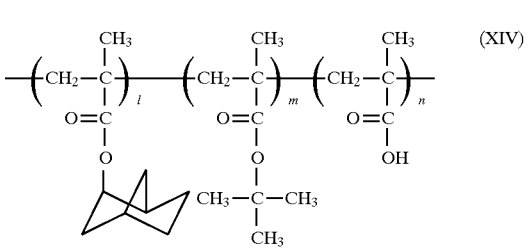 (XIV)

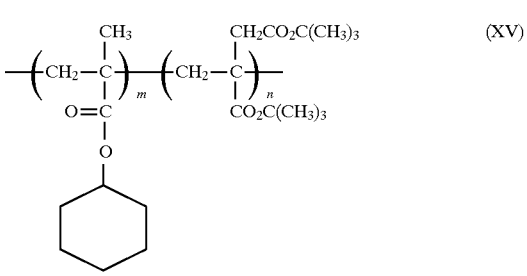 (XV)

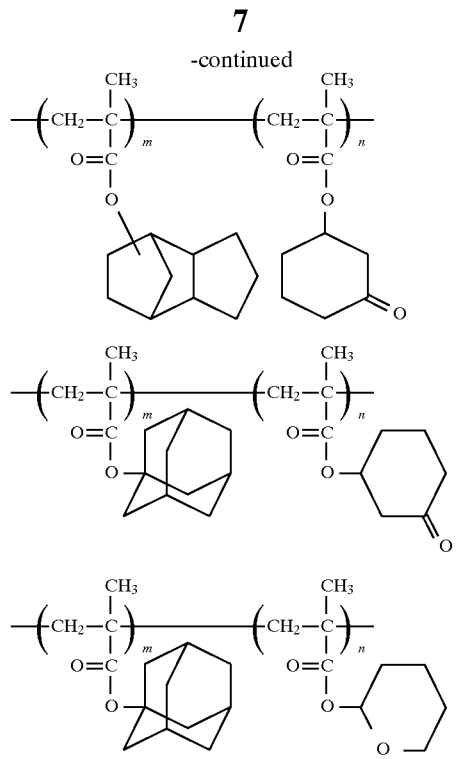

(XVI)

(XVII)

(XVIII)

Acid generators used in combination with said polymers or copolymers in the chemical amplification resists can be those commonly used in resist chemistry. Namely, they can be substances generating protonic acids upon irradiation by radiation such as ultraviolet light, far ultraviolet light, vacuum ultraviolet light, electron beam, X-ray or laser beam. Acid generators suitable in the practice of the present invention include, but are not limited to, the following compounds;

(1) Diazonium salts represented by the following formula:

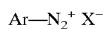

Ar—$N_2^+$ $X^-$ wherein Ar represents a substituted or unsubstituted aromatic group, for example, a phenyl group, or represents an alicyclic group, and X represents a halogen, for example, Cl, Br, I or F, $BF_4$, $BF_6$, $PF_6$, $AsF_6$, $SbF_6$, $CF_3SO_3$, $ClO_4$ or an organic sulfonic acid anion;

(2) Iodonium salts represented by the following formula;

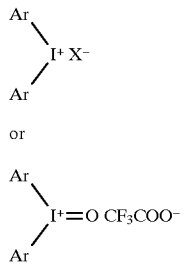

wherein Ar and X have the same definitions as those mentioned above;

(3) Sulfonium salts represented by the following formula:

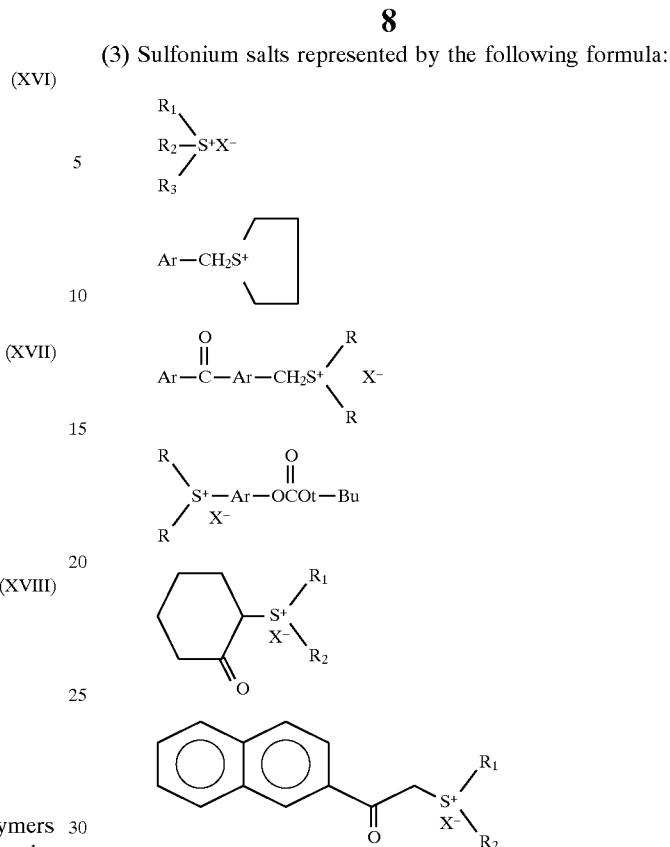

wherein R, $R_1$, $R_2$, $R_3$, Ar and X have the same definitions as those mentioned above, for example R is a methyl group, and $R_1$, $R_2$ and $R_3$ is a phenyl group;

(4) Sulfonic acid esters represented by the following formula:

Ar—$COCH_2SO_2$—Ar or

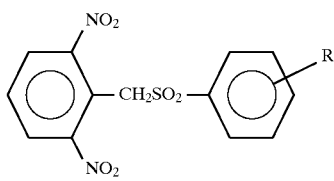

wherein Ar and R have the same definitions as those mentioned above;

(5) Oxazole derivatives represented by the following formula:

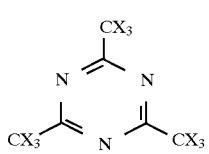

wherein X has the same definition as that mentioned above, provided that one of $-CX_3$ groups may be a substituted or unsubstituted aryl or alkenyl group;

(6) s-triazine derivatives represented by the following formula:

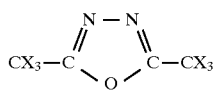

wherein X has the same definition as that mentioned above, provided that one of the -CX₃ groups may be a substituted or unsubstituted aryl or alkenyl group;

(7) Disulfone derivatives represented by the following formula:

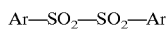

wherein Ar has the same definition as that mentioned above;

(8) Imide compounds represented by the following formulae:

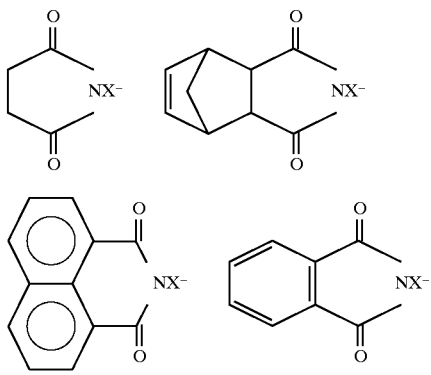

wherein X has the same definition as that mentioned above; and (9) Other compounds, for example, oxime sulfonate, diazonaphthoquinone and benzoin tosylate.

More particularly, some definite examples of these acid generators are as follows:

Triphenylsulfonium hexafluoroantimonate

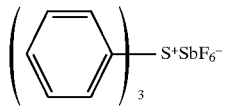

Triphenylsulfonium hexafluorophosphate

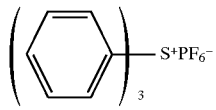

Diphenyliodonium hexafluorophosphate

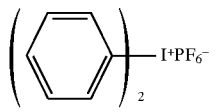

Benzoin tosylate

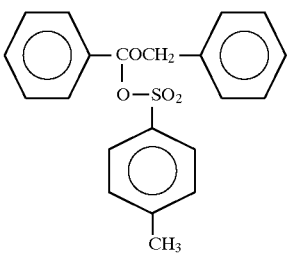

In the practice of the present invention, a chemical amplification resist comprising the above-described polymer or copolymer and an acid generator is prepared. For example, such resist can be prepared by polymerizing a monomer selected in order to form an object polymer or copolymer in the presence of an appropriate polymerization initiator, as currently conducted in resist chemistry, then adding an acid generator to a solution of the resulting polymer or copolymer to form a resist solution. The polymerization conditions and the polymerization initiator used herein can be optionally selected and a wide range of conditions and initiators can be used. For example, as an appropriate polymerization initiator, the following compounds can be mentioned;

AIBN (azoisobutyronitrile)

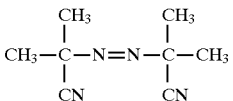

MAIB (dimethyl 2, 2-azoisobisbutylate)

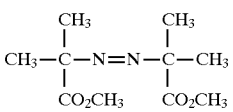

An amount of an acid generator to be added to a polymer or copolymer can be widely varied. Generally, it is about 1 to 30% by weight, preferably about 1 to 15% by weight.

A solvent used for the preparation of a resist solution can be varied depending upon a kind of a resist, coating conditions and other factors. However, for example, it is preferably an organic solvent such as cyclohexanone, propylene glycol monomethyl ether acetate (PGMEA) or ethyl lactate.

The solution of the resulting chemical amplification resist is coated on a substrate to be fabricated. The substrate used herein can be any base material usually used in semiconductor devices and other devices. Specifically, it can be silicon, an oxidized film, polysilicon, a nitride film, aluminum and others. A circuit can be or may not be previously built-in on the substrate. In order to improve the adhesion with a resist, optionally, the substrate is preferably treated with an adhesion accelerator such as hexamethyldisilazane (HMDS).

The coating of a resist solution can be effected by means of an ordinary coating device such as a spin coater, dip coater and roller coater. A layer thickness of a resist film formed can be widely varied depending upon factors such as an object for utilization of the resist film. However, it is generally within a range of about 0.3 to 2.0 μm.

Then, the formed resist film is prebaked, prior to being selectively exposed to a radiation, at a temperature of about 60° to 150° C., preferably about 60° to 100 °C. for about 60 to 180 seconds. This prebaking can be conducted by a heating means such as a hot plate.

Further, depending upon necessity, in order to solve a problem inherent to a chemical amplification resist, for example, PED (Post Exposure Delay), a top coat film (protecting layer) can be further provided over the resist film. In such a case, a top coat can be formed by coating, for example, a solution of a hydrocarbon polymer such as olefin resin on a resist film according to a spin coat method, followed by baking at about 100° C. As the coating solvent of the hydrocarbon polymer, mention may be made of, but is not limited to, limonene, 1,5-cyclooctadiene, 1-decene, t-butylcyclohexene, p-cymene and dodecyl benzene.

After prebaking the resist film, the film is selectively exposed to radiation by means of an ordinary exposure apparatus. As an appropriate exposure apparatus, a commercially available ultraviolet ray (far ultraviolet ray, vacuum ultraviolet ray) exposure apparatus, X-ray exposure apparatus, electron beam exposure apparatus and excimer stepper may be mentioned. Exposing conditions can be selected appropriately in each case. As a result of this selective exposure, an acid is generated from an acid generator in the resist film.

Then, the exposed resist film is subjected to Post Exposure Bake (PEB), whereby a cleavage reaction of a protecting group is caused with the acid as a catalyst. This Post Exposure Bake can be effected in the same manner as in the above-described prebaking. For example, the baking temperature is about 60° to 150° C., preferably about 100° to 150° C. and the baking time is about 60 to 180 seconds. When a top coat is used together, it should be peeled off by, for example, an organic solvent, after PEB and before development.

After completion of PEB, the exposed resist film is developed with a developer containing an aqueous solution or alcoholic solution of an ammonium compound of the above-described formula (I), a morpholine compound of the above-described formula (II), or the mixture thereof, according to an ordinary method. Preferable examples of an ammonium compound as a developer include, but are not limited to, the following compounds:

Tetrabutyl ammonium hydroxide (TBAH);

Tetraethyl ammonium hydroxide (TEAH); and

Tetrapropyl ammonium hydroxide (TPAH).

The developers are dissolved in water or an alcohol such as methanol, ethanol or isopropyl alcohol to form a developing solution. The concentration of a developer to be dissolved can be varied widely. However, it is generally about 0.1 to 15% by weight, preferably about 0.1 to 10% by weight. The developing time is, but is not limited to, generally about 1 to 5 minutes, preferably about 1 to 3 minutes. As the result of the development, the exposed region of the resist film is dissolved and eliminated so that a desired resist pattern can be obtained. Finally, the resulting resist pattern is rinsed with pure water and dried according to an ordinary method.

According to the present invention, in combination with the above-described chemical amplification resist, an aqueous solution or an alcoholic solution of a specified ammonium compound or morpholine compound is used as a developing solution so that the affinity of the developing solution with the resist resin and the solubility of the resist resin therein may be controlled, by which stress generated at the time of developing is moderated. Thus, peeling of the resist pattern and the generation of cracks can be reduced and the stable patterning characteristics can be obtained.

It was proved that the developing solution used in the present invention can produce particularly noticeable effects in a resist comprising a polymer or a copolymer having a low polarity. However, it can also produce sufficient effects in other resists. As a resist which can achieve extremely noticeable effects, mention may be made of adamantane or the derivatives thereof, norbornane or the derivatives thereof, cyclohexane or the derivatives thereof, tricyclo [5, 2, 1, 0$^{2,6}$] decane or the derivatives thereof.

EXAMPLE

The present invention will be explained in detail by way of Examples. It should be understood, however, that the present invention is by no means limited thereto.

Example 1

Adamantylmethacrylate monomer and t-butyl acrylate monomer were charged into a polymerizer at a ratio of 1:1 to form a toluene solution (0.5 mol/L). To this toluene solution was added a polymerization initiator, AIBN, (azoisobutyronitrile) in the amount of 20 mol %, whereby the polymerization was effected at 80° C. for about 8 hours. After the completion of the polymerization, purification was effected using methanol as a precipitating medium. Thus, adamantylmethacrylate-co-t-butylacrylate copolymer represented by the following formula could be obtained.

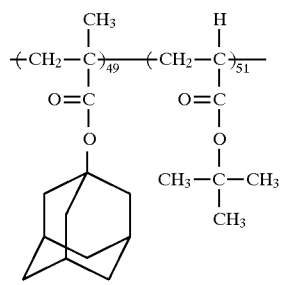

The resulting copolymer had a composition rate (m:n) of 49:51, a weight average molecular weight (Mw) of 5485 and a dispersibility (Mw/Mn) of 1.31. The glass transition temperature of the copolymer (Tg) was 126° C. according to a thermal analysis.

Example 2

To the adamantylmethacrylate-co-t-butylacrylate copolymer prepared in the above-described Example 1, was added 15% by weight of an acid generator, triphenylsulfonium hexafluoroantimonate, which was dissolved in cyclohexanone. The resulting resist solution was spin-coated on a silicon substrate, pretreated with hexamethyldisilazane (HMDS), at a thickness of 0.7 μm, and the coated substrate was prebaked on a hot plate at 60° C. for 100 seconds.

After the completion of prebaking, the resulting resist film was selectively exposed to a pattern of a KrF laser beam having a wave length of 248 nm by means of a KrF excimer stepper (manufactured by Nikon K.K., NA=0.45). The exposed resist film was then subjected to PEB at 100° C. for 60 seconds. Thereafter, the resist film was developed with an aqueous solution of 0.27N tetrabutylammonium hydroxide (TBAH) for 60 seconds, followed by rinsing with pure water for 30 seconds. The desired resist pattern corresponding to the laser beam pattern used in the exposure could be obtained without causing cracks. In the present Example, the threshold energy Eth of the irradiation dose was 21 mJ/cm$^2$ and the resolution power was 0.275 μm L&S (line and space).

Example 3

The procedure described in the above-described Example 2 was repeated, provided that in the present Example, as a developing solution, instead of 0.27N aqueous TBAH solution, an aqueous morpholine solution having the same concentration (0.27N) was used. As in the above-described Example 2, a desired resist pattern having Eth of 216 mJ/cm$^2$ and a resolution power of 0.30 μm L&S could be obtained.

Example 4

The procedure described in the above-described Example 3 was repeated, provided that in the present Example, the concentration of the aqueous morpholine solution used as the developing solution was changed to 1.18N. As in the above-described Example 3, a desired resist pattern having Eth of 96 mJ/cm$^2$ and a resolution power of 0.275 μm L&S could be obtained.

Example 5

The procedure described in the above-described Example 2 was repeated, provided that in the present Example, as a developing solution, instead of 0.27N aqueous TBAH solution, a methanolic solution of TBAH having the same concentration (0.27N) was used. As in the above-described Example 2, a desired resist pattern having Eth of 25 mJ/cm$^2$ and a resolution power of 0.30 μm L&S could be obtained.

Example 6

The procedure described in the above-described Example 2 was repeated, provided that in the present Example, as a developing solution, instead of 0.27N aqueous TBAH solution, 10% by weight of aqueous TBAH solution was used. As in the above-described Example 2, a desired resist pattern having Eth of 51 mJ/cm$^2$ and a resolution power of 0.30 μm L&S could be obtained.

Example 7 (Comparative Example)

The procedure described in the above-described Example 2 was repeated, provided that in the present Example, for the purpose of comparison, as a developing solution, instead of 0.27N aqueous TBAH solution, an aqueous tetramethyl ammonium hydroxide (TMAH) solution having the same concentration (0.27N) was used. Although a resist pattern could be obtained, it had an Eth of 25 mJ/cm$^2$ and a minimum resolution pattern of 0.35 μm L&S. The pattern smaller than the above resolution collapsed and could not be resolved.

Example 8 (Comparative Example)

The procedure described in the above-described Example 2 was repeated, provided that in the present Example, for the purpose of comparison, as a developing solution, instead of 0.27N aqueous TBAH solution, a mixture of NMD-3 (manufactured by Tokyo Oka K.K., aqueous TMAH solution) and isopropyl alcohol (IPA) (mixing ratio 1:1) was used. Although a resist pattern could be obtained, it had an Eth of 22 mJ/cm$^2$ and a minimum resolution pattern of 0.40 μm L&S. In the present Example, cracks were formed and, as the result, the fine pattern was peeled off and disappeared.

Example 9 (Comparative Example)

The procedure described in the above-described Example 2 was repeated, provided that in the present Example, for the purpose of comparison, as a developing solution, instead of 0.27N aqueous TBAH solution, an aqueous solution of 10% by weight of tetramethyl ammonium hydroxide (TMAH) was used. In the present Example, the peeling of the resist was noticeable and only a resist pattern having a minimum resolution power of 0.40 μm L&S could be obtained.

Example 10 (Comparative Example)

The procedure described in the above-described Example 2 was repeated, provided that in the present Example, for the purpose of comparison, as a developing solution, instead of 0.27N aqueous TBAH solution, an isopropyl alcohol solution of TBAH having the same concentration (0.27N) was used. In the present Example, not only the exposed portion of the resist coating, but also the unexposed portion thereof completely disappeared.

Example 11

Adamantylmethacrylate monomer and 3-oxocyclohexylmethacrylate monomer were charged into a polymerizer at a ratio of 1:1 to form a toluene solution (2 mol/L). To this toluene solution, was added a polymerization initiator, AIBN in the amount of 5 mol %, whereby the polymerization was effected at 80° C. for about 8 hours. After the completion of the polymerization, purification was effected using methanol as a precipitating medium. Thus, adamantylmethacrylate-co-3-oxocyclohexylmethacrylate copolymer represented by the following formula could be obtained.

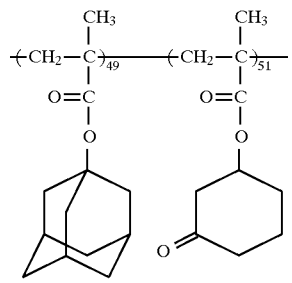

The resulting copolymer had a composition rate (m:n) of 49:51, a weight average molecular weight (Mw) of 14400 and a dispersibility (Mw/Mn) of 1.41. The copolymer did not show a glass transition temperature (Tg).

Example 12

To the adamantylmethacrylate-co-3-oxocyclohexylmethacrylate copolymer prepared in the above-described Example 11, was added 5% by weight of an acid generator, triphenylsulfonium hexafluoroantimonate, which was dissolved in cyclohexanone. The resulting resist solution was spin-coated on a silicon substrate, pretreated with hexamethyldisilazane (HMDS), at a thickness of 0.7 μm, the coated substrate was then prebaked on a hot plate at 100° C. for 100 seconds.

After the completion of prebaking, the resulting resist film was selectively exposed to a pattern of a KrF laser beam having a wave length of 248 nm by means of a KrF eximer stepper (manufactured by Nikon K.K., NA=0.45). The exposed resist film was then subjected to PEB at 150° C. for 60 seconds. Thereafter, the resist film was developed with an aqueous solution of 0.27N tetrabutylammonium hydroxide (TBAH) for 60 seconds, followed by rinsing with pure water for 30 seconds. The desired resist pattern corresponding to the laser beam pattern used in the exposure could be obtained without causing cracks. In the present Example, the threshold energy Eth of the irradiation dose was 26.5 mJ/cm$^2$ and the resolution power was 0.275 μm L&S.

Example 13

The procedure described in the above-described Example 12 was repeated, provided that in the present Example, as a developing solution, instead of 0.27N aqueous TBAH solution, an aqueous tetrapropylammonium hydroxide (TPAH) solution having the same concentration (0.27N) was used. As in the above-described Example 12, a desired resist pattern having an Eth of 19.5 mJ/cm$^2$ and a resolution power of 0.275 μm L&S could be obtained.

Example 14

The procedure described in the above-described Example 12 was repeated, provided that in the present Example, as a developing solution, instead of 0.27N aqueous TBAH solution, an aqueous tetraethylammonium hydroxide (TEAH) solution having the same concentration (0.27N) was used. As in the above-described Example 12, a desired resist pattern having an Eth of 17 mJ/cm$^2$ and a resolution power of 0.275 μm L&S could be obtained.

Example 15

The procedure described in the above-described Example 12 was repeated, provided that, in the present Example, as a developing solution, instead of 0.27N aqueous TBAH solution, 10% by weight of aqueous TBAH solution was used. As in the above-described Example 12, a desired resist pattern having an Eth of 50 mJ/cm$^2$ and a resolution power of 0.30 μm L&S could be obtained.

Example 16 (Comparative Example)

The procedure described in the above-described Example 12 was repeated, provided that in the present Example, for the purpose of comparison, as a developing solution, instead of 0.27N aqueous TBAH solution, an aqueous tetramethyl ammonium hydroxide (TMAH) solution having the same concentration (0.27N) was used. Although a resist pattern could be obtained, it had an Eth of 24 mJ/cm$^2$ and a minimum resolution pattern of 0.55 μm L&S. The pattern smaller than the above resolution was peeled off and disappeared.

Example 17 (Comparative Example)

The procedure described in the above-described Example 12 was repeated, provided that in the present Example, for the purpose of comparison, as a developing solution, instead of 0.27N aqueous TBAH solution, an aqueous solution of 10% by weight of tetramethyl ammonium hydroxide (TMAH) was used. In the present Example, the peeling of the resist was noticeable and only a resist pattern having the minimum resolution pattern of 0.60 μm L&S could be obtained.

Example 18 (Comparative Example)

The procedure described in the above-described Example 12 was repeated using the adamantylmethacrylate-co-t-butylacrylate copolymer prepared according to the manner of the above-described Example 1 (composition ratio= 51:49, weight average molecular weight=4915, dispersibility=1.46), provided that in the present Example, for the purpose of comparison, instead of 0.27N aqueous TBAH solution, an aqueous benzyltrimethyl ammonium hydroxide (BzTMAH) solution having the same concentration (0.27N) was used. In the resist pattern obtained in this Example, a pattern having a size of 0.5 μm L&S or smaller was not resolved and a pattern over this size showed a poor adhesion.

Example 19 (Comparative Example)

The procedure described in the above-described Example 18 was repeated, provided that in the present Example, for the purpose of comparison, as a developing solution, instead of 0.27N aqueous BzTMAH solution, a mixture of 0.27N NMD-3 (manufactured by Tokyo Oka K.K., aqueous TMAH solution)/1,4-dioxane (mixing ratio 2:1) was used. In this case, although a resist pattern could be obtained, the patterns having a size of 0.4 μm L&S or less were peeled off.

Example 20 (Comparative Example)

The procedure described in the above-described Example 18 was repeated, provided that in the present Example, for the purpose of comparison, as a developing solution, instead of 0.27N aqueous BzTMAH solution, a mixture of 0.27N NMD-3 (manufactured by Tokyo Oka K.K., aqueous TMAH solution)/ethyl Cellosolve (EC) (mixing ratio 2:1) was used. As in the above-described Example 19, also in the present case, the patterns having a size of 0.4 μm L&S or less were peeled off.

Example 21 (Comparative Example)

The procedure described in the above-described Example 18 was repeated, provided that in the present Example, for the purpose of comparison, as a developing solution, instead of 0.27N aqueous BzTMAH solution, an isopropyl alcohol solution of TBAH having the same concentration (0.27N) was used. In the present Example, not only the exposed portion of the resist film, but also the unexposed portion thereof completely disappeared.

Example 22

Adamantylmethacrylate-co-t-butylacrylate copolymer was prepared according to the manner described in the above-described Example 1 (composition ratio=51:49, weight average molecular weight=4915, dispersibility= 1.46). Then, to this copolymer was added 5% by weight of an acid generator, triphenylsulfonium hexafluoroantimonate, which was dissolved in cyclohexanone. The resulting resist solution was spin-coated on a silicon substrate, pretreated with hexamethyldisilazane (HMDS), at a thickness of 0.4 μm, and the coated substrate was then prebaked on a hot plate at 60° C. for 100 seconds.

After the completion of prebaking, the resulting resist film was selectively exposed to a pattern of ArF laser beam having a wave-length of 193 nm by means of a ArF exposure device (manufactured by Nikon K.K., NA=0.55). Successively, the exposed resist film was subjected to PEB at 130° C. for 60 seconds. Thereafter, the resist film was developed with an aqueous solution of 0.27N tetrabutylammonium hydroxide (TBAH) for 60 seconds, followed by rinsing with pure water for 30 seconds. Thus, the desired resist pattern could be obtained without causing cracks. In the present Example, the threshold energy Eth of the irradiation dose was 9 mJ/cm$^2$ and the resolution power was 0.2 μm L&S.

Example 23 (Comparative Example)

The procedure described in the above-described Example 22 was repeated, provided that in the present Example, for the purpose of comparison, as a developing solution, instead of 0.27N aqueous TBAH solution, an aqueous tetramethyl ammonium hydroxide (TMAH) solution having the same concentration (0.27N) was used. In this Example, although a resist pattern having a size of 0.35 μm L&S could be obtained, a pattern less than this size was peeled off and disappeared.

Example 24

Adamantylmethacrylate-co-3-oxocyclohexylmethacrylate copolymer (composition ratio=50:50, weight average molecular weight=14400, dispersibility=2.1) was prepared according to the manner described in the above-described Example 11. Then, to this copolymer was added 5% by weight of an acid generator, triphenylsulfonium hexafluoroantimonate, which was dissolved in cyclohexanone. The resulting resist solution was spin-coated on a silicon substrate, pretreated with hexamethyldisilazane (HMDS), at a thickness of 0.4 μm, and the coated substrate was then prebaked on a hot plate at 100° C. for 100 seconds.

After the completion of prebaking, the resulting resist film was selectively exposed to a pattern of ArF laser beam having a wave length of 193 nm by means of a ArF exposure device (manufactured by Nikon K.K., NA=0.55). Successively, the exposed resist film was subjected to PEB at 150° C. for 60 seconds. Thereafter, the resist film was developed with an aqueous solution of 0.27N tetrabutylammonium hydroxide (TBAH) for 60 seconds, followed by rinsing with pure water for 30 seconds. The desired resist pattern could be obtained without causing cracks. In the present Example, threshold energy Eth of the irradiation dose was 6 mJ/cm² and the resolution power was 0.17 μm L&S. The pattern ratio of 1:1 could be retained.

Example 25

The procedure described in the above-described Example 24 was repeated, provided that in the present Example, prior to selectively exposing a resist film to ArF laser beam, an olefin resin was spin-coated thereon at a thickness of 0.2 μm to form a top coat. This top coat was peeled off prior to developing. A resist pattern having a size of 0.16 μm L&S was formed in a desired shape keeping a ratio of 1:1.

Example 26 (Comparative Example)

The procedure described in the above-described Example 24 was repeated, provided that in the present Example, for the purpose of comparison, as a developing solution, instead of 0.27N aqueous TBAH solution, a mixture of 0.27N NMD-3 (manufactured by Tokyo Oka K.K., aqueous TMAH solution)/isopropyl alcohol (IPA) (mixing ratio 5:1) was used. In this case, although a resist pattern could be obtained, the pattern having a size of 0.2 μm L&S or less could not have a ratio of 1:1.

Example 27 (Comparative Example) The procedure described in the above-described Example 26 was repeated, except that the mixing ratio of NMD-3 and IPA was changed to 8:1, 9:1 and 10:1, respectively. In each case, a fine pattern having a size of 0.2 μm L&S or less could not be formed.

Capability of Exploitation in Industry

According to the present invention, by using an aqueous solution or alcoholic solution of a specified ammonium compound or morpholine compound as a developing solution in combination with a chemical amplification resist as mentioned above, affinity with the resist resin and the solubility are controlled, whereby the stress generated upon development is moderated. Thus, peeling of the resist pattern and the crack formation therein are decreased so that stable patterning characteristics can be obtained. Accordingly, the method of the present invention can be advantageously utilized in the production of semiconductor devices such as LSIs and VLSIs.

We claim:

1. A method for forming resist patterns which comprises the steps of:

coating a resist comprising (i) a (meth) acrylic polymeric or copolymeric compound having a repeating unit comprising a protected alkali-soluble group in which a protecting group is cleaved with an acid so that the compound is made alkali-soluble, and (ii) an acid generator capable of generating an acid when the resist is exposed to radiation, to a substrate to be fabricated, after pre-baking the formed resist film, selectively exposing the resist film on the substrate to radiation capable of inducing the generation of an acid from said acid generator, and after post-baking the exposed resist, developing a latent image formed during said exposure step with a developer comprising (a) an aqueous or alcoholic solution of an ammonium compound which is tetraethyl ammonium hydroxide, tetrabutyl ammonium hydroxide, or tetrapropyl ammonium hydroxide, or (b) a morpholine compound having the following formula (II):

(II)

2. A method as claimed in claim 1, in which said alkali-soluble group is a group of carboxylic acid.

3. A method as claimed in claim 1 or 2, in which the protecting group for said alkali-soluble group is a quaternary carbon ester or an ester of β-oxyketone.

4. A method as claimed in any one of claims 1 or 2, in which an alicyclic hydrocarbon group is contained in said polymer or copolymer compound.

5. A method as claimed in claim 4, in which the alicyclic hydrocarbon group in said polymer or copolymer compound has a skeleton of a compound selected from the group consisting of the following compounds:

(1) adamantane and derivatives thereof, (2) norbornane and derivatives thereof, (3) cyclohexane and derivatives thereof, (4) perhydroanthracene and derivatives thereof, (5) perhydronaphthalene and derivatives thereof, (6) tricyclo [5, 2, 1, 0$^{2,6}$] decane and derivatives thereof, (7) bicyclohexane and derivatives thereof, (8) spiro [4, 4] nonane and derivatives thereof, and (9) spiro [4, 5] decane and derivatives thereof.

6. A method as claimed in claim 1, in which said acid generator is a compound selected from the group consisting of:

(1) a diazonium salt, (2) a iodonium salt, (3) a sulfonium salt, (4) a sulfonic acid ester, (5) oxazole derivatives, (6) s-triazine derivatives, (7) disulfone derivatives, (8) an imide compound, (9) oxime sulfonate,

(10) diazonaththoquinone, and

(11) benzoin tosylate.

7. A method as claimed in claim 6, in which said acid generator is triphenylsulfonium hexafluoroantimonate, triphenylsulfonium hexafluorophosphate, diphenyliodonium hexafluorophosphate or benzoin tosylate.

8. A method as claimed in claim 1, which comprises coating said resist to the substrate at a thickness of 0.3 to 2.0 μm, after pre-baking the formed resist film at a temperature of 60° to 150° C. for 60 to 180 seconds, selectively exposing the resist film on said substrate to radiation capable of inducing the generation of an acid from the said acid generator, after post-baking the exposed resist at a temperature of 60° to 150° C. for 60 to 180 seconds, developing a latent image formed during said exposure step with a developer comprising an aqueous solution or alcoholic solution containing 0.1 to 15% by weight of said ammonium compound or morpholine compound.

9. A method as claimed in claim 8, in which said alcohol of said developer is methanol, ethanol or isopropyl alcohol.

* * * * *